(12) United States Patent
Johnson (10) Patent No.: US 7,808,289 B2
(45) Date of Patent: *Oct. 5, 2010

(54) METHOD AND APPARATUS FOR DIGITAL PHASE GENERATION FOR HIGH FREQUENCY CLOCK APPLICATIONS

(75) Inventor: Gary M. Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/847,908

(22) Filed: Aug. 30, 2007

(65) Prior Publication Data

US 2008/0042707 A1    Feb. 21, 2008

Related U.S. Application Data

(63) Continuation of application No. 11/218,123, filed on Sep. 1, 2005, now Pat. No. 7,304,516.

(51) Int. Cl.
*H03L 7/06* (2006.01)
(52) U.S. Cl. .................. 327/158; 327/161; 327/163
(58) Field of Classification Search ......... 327/293–295, 327/149, 153, 158, 161–163
See application file for complete search history.

(56) References Cited

U.S. PATENT DOCUMENTS

| | | | |
|---|---|---|---|
| 5,537,068 A | 7/1996 | Konno | |
| 5,828,250 A | 10/1998 | Konno | |
| 6,069,507 A | 5/2000 | Shen et al. | |
| 6,100,735 A | 8/2000 | Lu | |
| 6,137,325 A | 10/2000 | Miller, Jr. | |
| 6,297,680 B1 | 10/2001 | Kondo | |
| 6,323,705 B1 | 11/2001 | Shieh et al. | |
| 6,445,231 B1 | 9/2002 | Baker et al. | |
| 6,535,043 B2 | 3/2003 | Chen | |
| 6,628,154 B2 | 9/2003 | Fiscus | |
| 6,636,093 B1 | 10/2003 | Stubbs et al. | |
| 6,650,160 B2 | 11/2003 | Tanahashi | |
| 6,677,792 B2 | 1/2004 | Kwak | |
| 6,727,739 B2 | 4/2004 | Stubbs et al. | |
| 6,920,552 B2 | 7/2005 | Lin et al. | |
| 6,950,487 B2 | 9/2005 | Lin et al. | |
| 7,057,429 B2 | 6/2006 | Kim | |
| 7,142,026 B2 | 11/2006 | Kwak | |
| 7,274,228 B2 * | 9/2007 | Kim | 327/149 |
| 7,304,516 B2 * | 12/2007 | Johnson | 327/158 |
| 2002/0172314 A1 | 11/2002 | Lin et al. | |
| 2002/0180501 A1 | 12/2002 | Baker et al. | |
| 2003/0117194 A1 | 6/2003 | Lee | |

* cited by examiner

*Primary Examiner*—Hai L Nguyen
(74) *Attorney, Agent, or Firm*—Traskbritt (57) ABSTRACT

An apparatus and method for generating phase-related clocks are disclosed. A clock input is delayed by an alignment magnitude to generate a first phase signal. The first phase signal is delayed by the phase alignment magnitude to generate a first phase delay signal. The clock input is delayed by a phase delay magnitude to generate a second phase signal and the second phase signal is delayed by about the phase delay magnitude to generate a last phase delay signal. A phase difference is detected between the first phase delay signal and the last phase delay signal and adjustments are made to at least one of the phase delay magnitude and the alignment magnitude.

13 Claims, 9 Drawing Sheets

METHOD AND APPARATUS FOR DIGITAL PHASE GENERATION FOR HIGH FREQUENCY CLOCK APPLICATIONS

CROSS-REFERENCE TO RELATED APPLICATION

This application is a continuation of application Ser. No. 11/218,123, filed Sep. 1, 2005, now U.S. Pat. No. 7,304,516 issued Dec. 4, 2007. The disclosure of the previously referenced U.S. patent application is hereby incorporated by reference in its entirety.

BACKGROUND OF THE INVENTION

1. Field of the Invention

This invention relates generally to delay locked loops, and particularly to multiple phase generation using delay locked loops.

2. Description of Related Art

In modern high frequency integrated circuits, it is often necessary to generate internal clocks with predetermined phase relationships to a reference clock. Conventionally, a Phase Locked Loop (PLL) or Delay Locked Loop (DLL) has been used to generate these predetermined phase relationships. For example, many reference input clocks may not have a 50% duty cycle. However, with modern semiconductor devices, such as Double Data Rate (DDR) Dynamic Random Access Memory (DRAM) devices, two data cycles may occur within one clock cycle. An internal clock with a 50% duty cycle may be needed so the two data cycles may be accurately sampled at the rising edge and the falling edge of the clock. Alternatively, an additional clock with a phase delay of 180 degrees relative to the reference clock may be used to sample one data slice and the reference clock may be used to sample the other data slice. Furthermore, modern semiconductor devices, such as DRAM and processors, may require multiple clocks with defined phase relationships to trigger events at various times during a clock cycle. For example, it may be desirable to have clocks with phase relationships of 90°, 180°, 270°, and 360° relative to a reference clock.

Various solutions exist for generating these desired duty cycles and clocks with defined phase relationships; these solutions are conventionally referred to as Duty Cycle Correctors (DCC) and phase generators. Conventionally, phase generators may be constructed as a DLL using either analog or digital delay lines. Analog delay lines may allow more precise control but may consume more silicon space or "real estate," consume more power, and take longer to achieve lock. Digital delay lines, on the other hand, are easier to design, smaller, and may consume less power. Digital delay lines may achieve lock faster than analog delay lines; however, digital delay lines may not be able to achieve the continuous fine-tuning available in an analog delay line.

Figure 1:
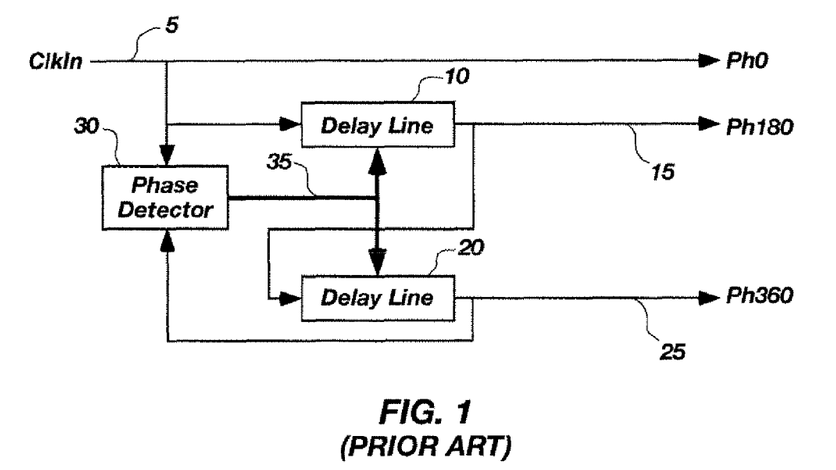
FIG. 1 is a block diagram of a conventional digital phase generator.

A conventional phase generator constructed as a DLL is shown in FIG. 1. A clock input 5 (also referred to as a ph0 signal) connects to a first delay line 10. A ph180 signal 15, generated by the first delay line 10, connects to a second delay line 20. A ph360 signal 25, from the output of the second delay line 20, feeds back to a phase detector 30. The phase detector 30 compares the phase of the clock input 5 to the second delay line 20 output. Because of the comparison, the phase detector 30 generates the delay control signal 35 controlling the delay lines (10 and 20) to either increase or decrease the delay. The first delay line 10 and second delay line 20 are of similar construction such that the delay control signal 35, connected to both delay lines (10 and 20), causes both delay lines to generate the same amount of delay. With this closed loop, the DLL "locks" on to the clock input 5 so that the ph360 signal 25 is at substantially the same phase and frequency as the clock input 5.

Because the two delay lines generate equivalent delays, the ph180 signal 15 is at the same frequency as, and 180 degrees out of phase with, the clock input 5. The phase detector 30 only compares rising edge to rising edge or falling edge to falling edge. As a result, the phase generator will lock and generate the ph180 signal 15 at 180 degrees out of phase regardless of the duty cycle of the clock input 5.

However conventional digital DLL phase generators have their limits. Due to the structure of the delay lines, there is a minimum delay and a maximum delay possible through each delay line. The lowest frequency input clock that the DLL is able to lock to is defined by the maximum delay. For example, if the maximum delay through each delay line is 50 nSec, the total maximum delay is 100 nSec, and the DLL can lock to clock frequencies of 10 Mhz or higher. On the other hand, if the minimum delay through each delay line is 2.5 nSec, the total minimum delay is 5 nSec. Consequently, if the input clock is faster than 200 Mhz (i.e., a clock period of less than 5 nSec), the DLL cannot lock to the clock input because the ph360 signal 25 cannot be brought any closer to the ph0 signal 5 than the minimum delay. Conventionally, DLL design involves considerations such as locking range (i.e., maximum delay) versus die size and power consumption.

Figure 2:
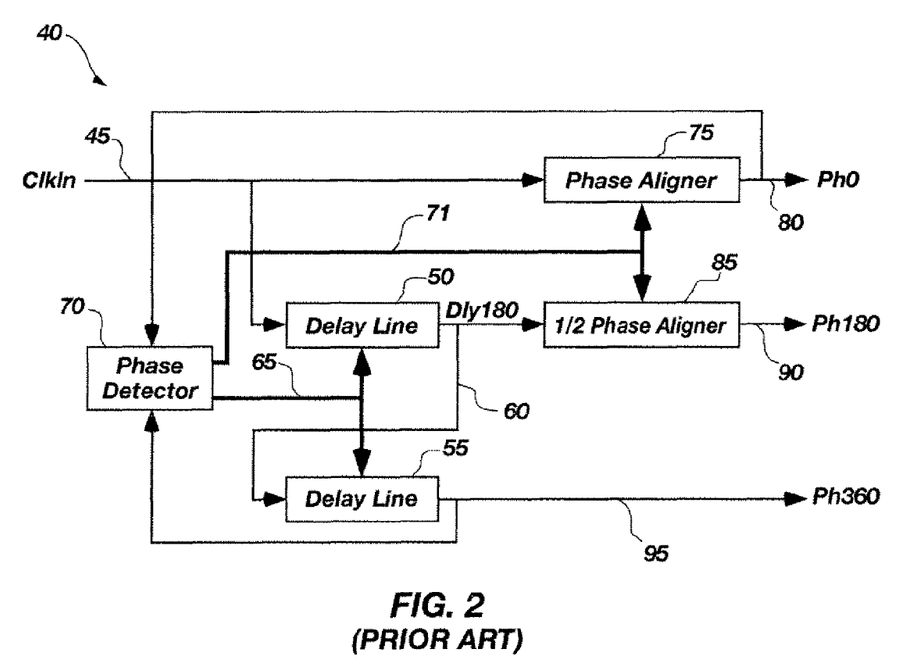
FIG. 2 is a block diagram of a conventional digital phase generator with increased operating frequency, and including additional intrinsic delay.

Other phase generator configurations have been proposed for increasing the clock frequencies beyond the minimum delay of the combined delay elements of a ALL. A phase generator 40 constructed as a DLL, which increases the operation frequency, is shown in FIG. 2. A phase generator 40 includes a phase detector 70, a first delay line 50, a second delay line 55, a first phase aligner 75 and a second phase aligner 85. A clock input 45 connects to the first delay line 50. A dly180 signal 60 is generated by the first delay line 50 and connects to the second delay line 55. A ph360 signal 95 is generated by the second delay line 55 and feeds back to the phase detector 70.

The clock input 45 also connects to the first phase aligner 75. A ph0 signal 80 is generated by the first phase aligner 75 and feeds back to the phase detector 70. A second phase aligner 85 connects to the dly180 signal 60 and generates a ph180 signal 90. The first and second delay lines 50, 55, respectively, are configured similarly with the same selectable delay increments. Consequently, both delay lines 50, 55 have substantially the same delay magnitude based on a phase adjustment signal 65, which is generated by the phase detector 70 and selects the delay increments, and as a result, the delay magnitude for both delay lines.

An alignment adjustment signal 71, generated by the phase detector 70, controls the alignment magnitudes (i.e., delay) of the first and second phase aligners 75, 85. The second phase aligner 85 is generally configured with delay increments that are one-half the size of the delay increments for the first phase aligner 75. Consequently, for any given value on the alignment adjustment signal 71, the second phase aligner 85 generates a delay magnitude that is substantially one-half the delay magnitude generated by the first phase aligner 75.

While such a configuration may allow for a higher frequency input clock 45, the forward path intrinsic delay is no longer substantially zero. As illustrated, the forward path intrinsic delay is the intrinsic delay for the ph0 signal 80 through the first phase aligner 75 and has been purposely increased to be out of phase with the ph0 signal 80.

There is a need for a digital phase generator that can lock and operate at higher frequencies without affecting the overall locking range of the DLL within the digital phase generator and without unduly inserting excessive delay in the forward path.

BRIEF SUMMARY OF THE INVENTION

The present invention enables digital phase generators and methods of generating multi-phase signals at higher clock speeds. An embodiment of the present invention comprises a method of generating multi-phase clocks. A clock input is delayed by an alignment magnitude to generate a first phase signal. The first phase signal is delayed by the phase alignment magnitude to generate a first phase delay signal. The clock input is delayed by a phase delay magnitude to generate a second phase signal and the second phase signal is delayed by about the phase delay magnitude to generate a last phase delay signal. A phase difference is detected between the first phase delay signal and the last phase delay signal and adjustments are made to at least one of the phase delay magnitude and the alignment magnitude.

Another embodiment of the present invention comprises a phase generator for generating multi-phase clocks. The phase generator includes a first phase aligner configured to generate a first phase signal with an alignment magnitude relative to a clock input and a second phase aligner configured to generate a first phase delay signal with substantially the alignment magnitude relative to the first phase signal. The phase generator further includes a first delay line configured to generate a second phase signal with a phase delay magnitude relative to the clock input and a second delay line configured to generate a last phase delay signal with the phase delay magnitude relative to the second phase signal. The phase generator also includes a phase detector configured to compare the first phase delay signal and the last phase delay signal and generate at least one of a phase adjustment signal for modifying the phase delay magnitude and an alignment adjustment signal for modifying the alignment magnitude.

Another embodiment of the present invention comprises a semiconductor device including at least one phase generator according to the invention described herein.

Another embodiment of the present invention includes at least one semiconductor device including at least one phase generator according to the present invention fabricated on a semiconductor wafer.

Yet another embodiments in accordance with the present invention comprises an electronic system including at least one input device, at least one output device, at least one processor, and at least one memory device. The at least one memory device comprises at least one semiconductor memory incorporating at least one phase generator according to the present invention.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF T INVENTION

In the following description, circuits and functions may be shown in block diagram for in order not to obscure the present invention in unnecessary detail. Conversely, specific circuit implementations shown and described are exemplary only, and should not be construed as the only way to implement the present invention unless specified otherwise herein. Additionally, block definitions and partitioning of logic between various blocks is exemplary of a specific implementation. It will be readily apparent to one of ordinary skill in the art that the present invention may be practiced by numerous other partitioning solutions. For the most part, details concerning timing considerations and the like have been omitted inasmuch as such details are not necessary to obtain a complete understanding of the present invention and are within the abilities of persons of ordinary skill in the relevant art.

The term "bus" is used to refer to a plurality of signals or conductors, which may be used to transfer one or more various types of information, such as data, addresses, control, or status. Additionally, a bus or collection of signals may be referred to in the singular as a signal.

Figure 3:
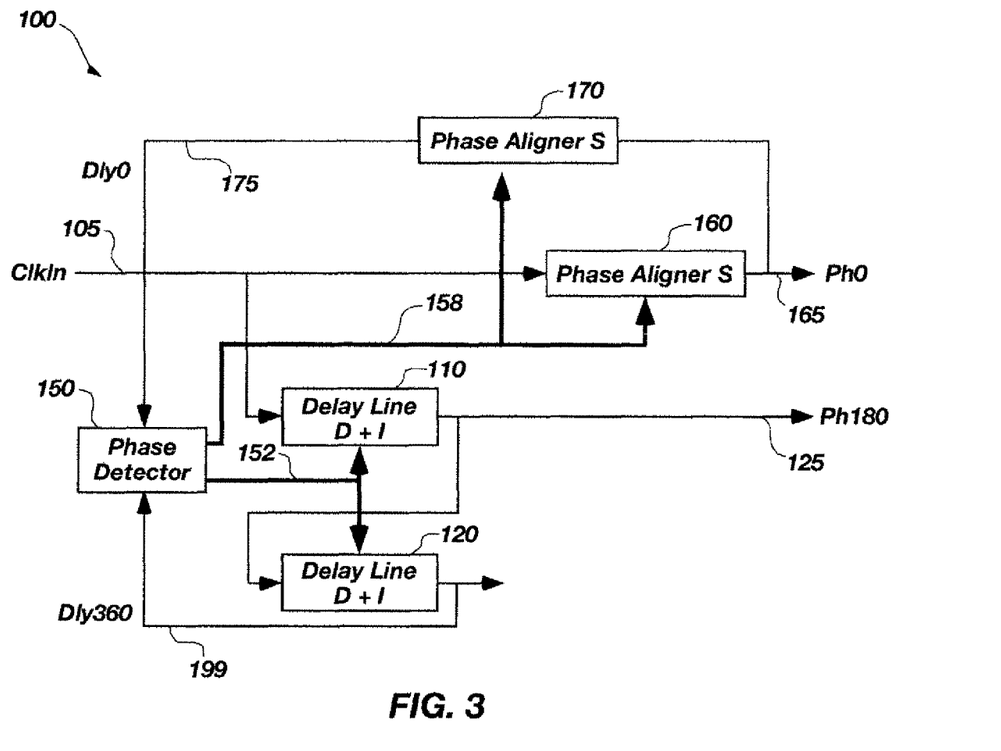
FIG. 3 is a block diagram of an exemplary digital phase generator, in accordance with an embodiment of the present invention.

As shown in FIG. 3, a phase generator 100 according to the present invention includes a phase detector 150, a first delay line 110, a second delay line 120, a first phase aligner 160 and a second phase aligner 170. A clock input 105 connects to the first delay line 110. A ph180 signal 125 (also referred to as a second phase signal) is generated by the first delay line 110 and connects to the second delay line 120. A dly360 signal 199 (also referred to as a last phase delay signal) is generated by the second delay line 120 and feeds back to the phase detector 150.

The clock input 105 also connects to the first phase aligner 160. A ph0 signal 165 (also referred to as a first phase signal) is generated by the first phase aligner 160 and feeds to a second phase aligner 170. The second phase aligner 170 generates a dly0 signal 175 (also referred to as a first phase delay signal) and feeds back to the phase detector 150.

The first and second delay lines (110 and 120) may be configured similarly with the same selectable delay increments. Consequently, both delay lines (110 and 120) will have substantially the same delay magnitude based on a phase adjustment signal 152, which is generated by the phase detector 150 and selects the delay increments, and as a result the delay magnitude for both delay lines.

An alignment adjustment signal 158, generated by the phase detector 150, controls the alignment magnitudes (i.e., delay) of the first and second phase aligners (160 and 170). The second phase aligner 170 may be configured with delay increments that are substantially equal to the size of the delay increments for the first phase aligner 160. Consequently, for any given value on the alignment adjustment signal 158, the second phase aligner 170 generates a delay magnitude that is substantially equal to the delay magnitude generated by the first phase aligner 160.

One of the improvements of the architecture of the various embodiments of the present invention is the reduction in the ph0 forward path delay (i.e., the delay between clock input 105 and ph0 signal 165) without surrendering the ability to minimize the frequency, tCKmin, of the clock input 105. A set of equations may be defined to show the delay relationships from the clock input 105 to the ph0 signal 165, the ph180 signal 125 and the dly360 signal 199. In the equations, S indicates the magnitude of the alignment delay, $t_A$, for the first phase aligner 160 and "D+I" indicates the phase delay magnitude, $t_D$, in each delay line (110 and 120) including the selectable/adjustable "D" delay and the "I" intrinsic delay associated therewith. Accordingly, when the loop has locked (i.e., dly0 signal 175 and dly360 signal 199 are in phase with each other) at a particular frequency tCK:

$tCK = t_D + t_D - t_A - t_A = (D+I) + (D+I) - S - S = 2[(D+I) - S]$ $t_{d1} = S$ $t_{d2} = (D+I)$ so, $t_{d2} - t_{d1} = (D+I) - S$ proving that the delta between $t_{d1}$ (Clkin to ph0) and $t_{d2}$ (Clkin to ph180) remains ½ tCK.

In the various embodiments of the present invention, the dly360 signal 199 is not in phase with the ph0 signal 165, but instead is in phase with the dly0 signal 175. The various embodiments of the present invention reduce the phase delay in the forward path, namely the path between clock input 105 and the ph0 signal 165 without compromising the tCKmin requirement.

In FIG. 3, when the phase generator 100 is locked, the dly360 signal 199 is one integer clock cycle behind the dly0 signal 175. In addition, the ph180 signal 125 should be substantially near the midpoint between a ph0 signal 165 and a subsequent ph0 signal 165. It should be noted that the dly360 signal 199 is in phase with the dly0 signal 175 rather than the ph0 signal 165. Therefore, in the present architecture and the respective embodiments of the present invention, there is no "true" phase 360 signal which in most applications is rarely used since the ph0 signal in the subsequent clock cycle contains a signal of the same phase.

The phase generator 100 may be contemplated as having two operation modes. In a first operation mode, the phase aligners (160 and 170) may be set to a predetermined value and the pair of delay lines (110 and 120) may be adjusted to effectively lock to the phase and frequency of the clock input 105. In other words, using the delay equations, hold $t_A$ constant and vary t(D+I) to achieve lock.

In a second operation mode, the pair of delay lines (10 and 120) may be set to a predetermined value and the alignment magnitude may be adjusted until the phase generator 100 locks the dly0 signal 175 to the dly360 signal 199. In other words, using the delay equations, hold $t_D$ or (D+I) constant and vary $t_A$ or "S" to achieve lock. It should be noted that "S" cannot be set greater than or equal to "I", as the loop would lock a signal to itself and be independent of tCK.

A group of timing diagrams illustrates the locking process, adjustment of the phase delay magnitude, and adjustment of the alignment magnitude. In the timing diagrams, arbitrary units are used to illustrate the various timing edge movements. These arbitrary units are not intended to illustrate actual delay numbers. For example, the clock cycles in the timing diagrams vary between 14 units and 6 units, and illustrate a minimum delay for the delay lines of 6 units. As an example of current process parameters for a design that may implement the present invention, the minimum delay through the delay lines may be about one to two nanoseconds. In addition, the timing diagrams all show references to rising edges of the various signals. It will be readily apparent to a person of ordinary skill in the art that the phase detector 150 may, alternatively, operate with respect to falling edges and the timing diagrams would be referenced to falling edges.

Figure 5A:
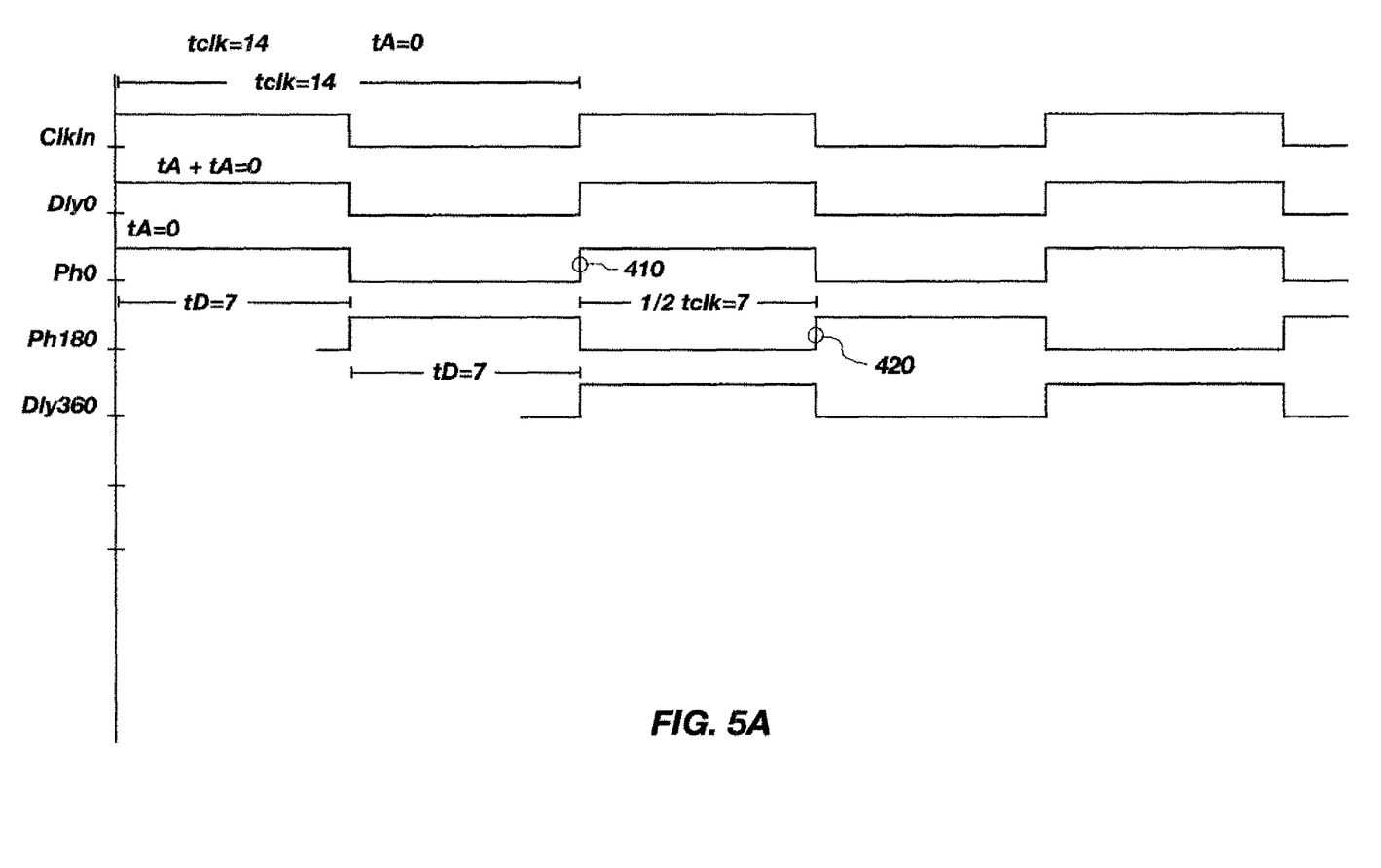
FIG. 5A is a timing waveform showing operation of various phases for the FIG. 3 embodiment at a clock cycle of 14 units and substantially zero alignment delay, in accordance with an embodiment of the present invention.
Figure 5B:
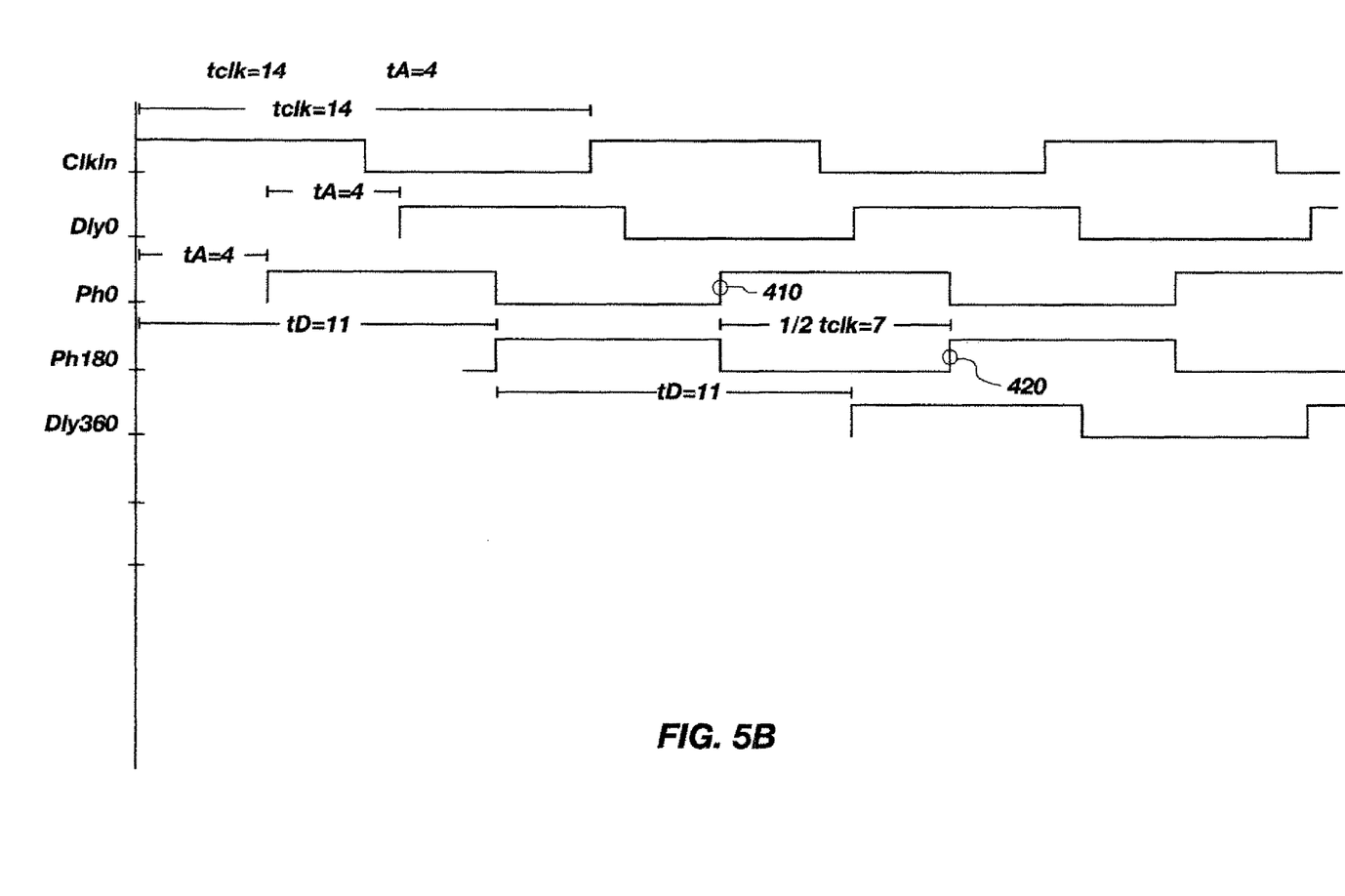
FIG. 5B is a timing waveform showing operation of various phases for the FIG. 3 embodiment at a clock cycle of 14 units and a predetermined alignment delay, in accordance with an embodiment of the present invention.
Figure 5C:
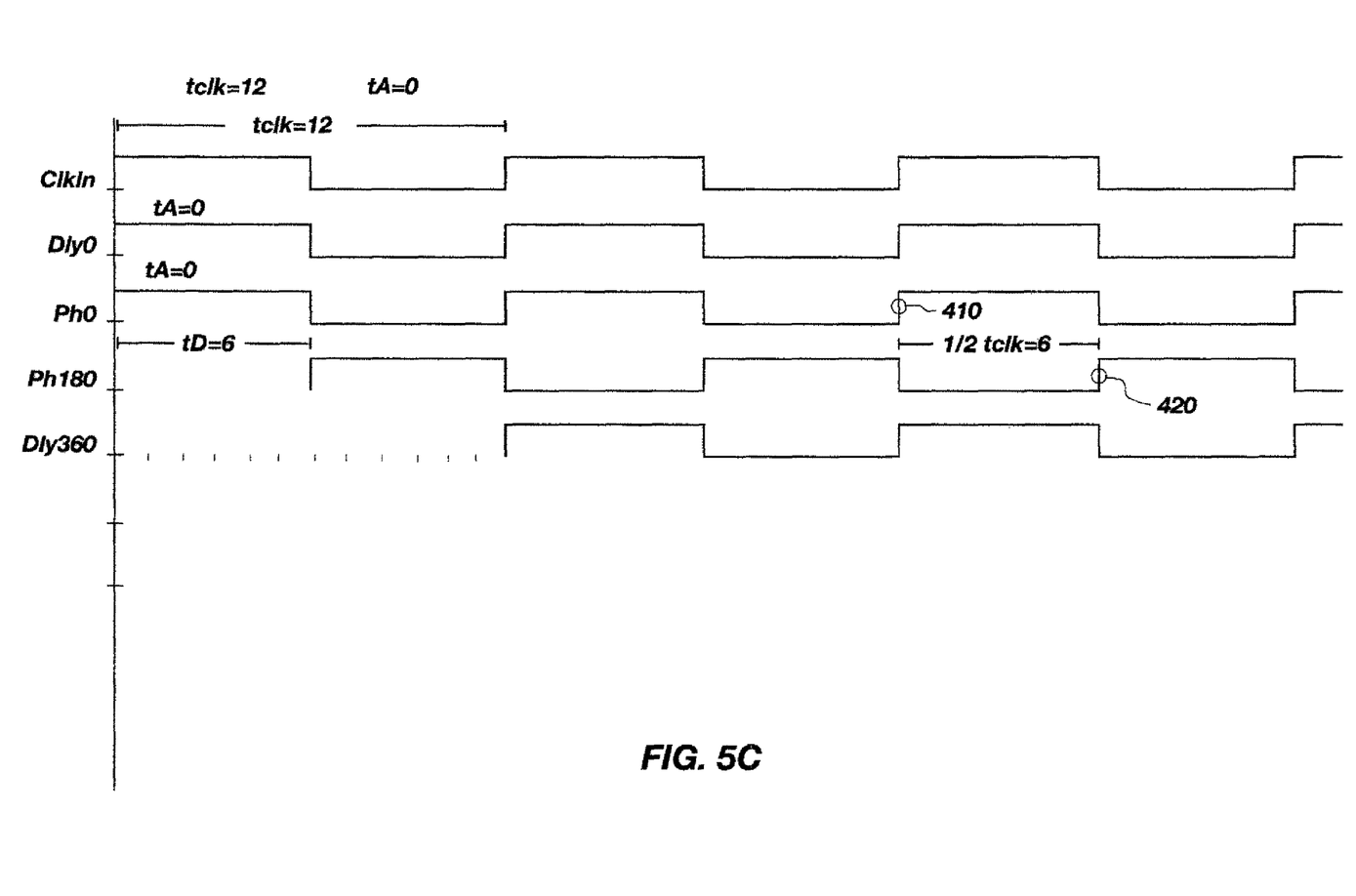
FIG. 5C is a timing waveform showing operation of various phases for the FIG. 3 embodiment at a clock cycle of 12 units, in accordance with an embodiment of the present invention.

The first operation mode is illustrated by FIGS. 5A, 5B, and 5C. The first operation mode may typically be used when the clock cycle is larger than the minimum delay of the first delay line 110 and the second delay line 120 combined. In the first operation mode, with the phase aligners set to a predetermined amount, the phase delay magnitude is adjusted in each of the delay lines to achieve lock.

For example, with reference to FIGS. 3 and 5A, the alignment magnitude (noted in the timing diagrams as $t_A$ or "S") is set to substantially near zero. This may be implemented as a bypass function within the first phase aligner 160 and second phase aligner 170. With the alignment magnitude at substantially zero, the second phase aligner 170 has a delay of the alignment magnitude, which will also be substantially near zero (noted in the timing diagrams as $t_A$). With these settings for the alignment magnitudes, the ph0 signal 165 follows the clock input 105 and the ph180 signal 125 is generated from the delay through the delay line 110. The phase detector 150 compares the dly0 signal 175 to the dly360 signal 199 to determine a phase error. As a result of the phase error, the phase detector 150 controls the phase adjustment signal 152 to either increase or decrease the phase delay magnitude (noted in the timing diagrams as $t_D$ or (D+I)).

If the delay lines are implemented as a conventional set of delays controlled by a shift register, the phase adjustment signal 152 may be implemented as shift left/shift right set of signals. Shift left may indicate a larger phase delay magnitude (for an entry point delay architecture) while shift right may indicate a smaller phase delay magnitude (note: the reverse is true for exit point delay architectures). Because the first delay line 110 and second delay line 120 are in series, an indication to change the phase delay magnitude by one increment will actually increase the total delay between the clock input 105 and the dly360 signal 199 by two increments.

The feedback loop, including phase comparison combined with increasing or decreasing adjustments of the phase delay magnitude, continues until the phase comparison shows the phase of the dly0 signal 175 and the dly360 signal 199 are substantially in phase. In FIG. 5A, with a clock cycle of 14 units, when phase lock is achieved, the phase delay magnitude $t_D$ or (D+I) is about 7 units if I=5 and D=2 resulting in tCKmin=10 without a phase aligner. The first alignment indicator 410 and the second alignment indicator 420 shows the rising edge of the ph180 signal 125 is substantially one-half the clock cycle after the ph0 signal 165.

In another example of the first operation mode, with reference to FIGS. 3 and 5B, the alignment magnitude is set to an initial value of four units since S must be less than I (set S=4 and I=5 for the present example). With the alignment magnitude at four units, the first and second phase aligners 160, 170 each have a delay of four units. In this example, the ph0 signal 165 starts out at a delay of four units relative to the clock input 105. Similarly, the dly0 signal 175 starts out with a delay of eight units relative to the clock input 105.

The feedback loop, including the phase comparison combined with increasing or decreasing adjustments of the phase delay magnitude, continues until the phase comparison shows the phase of the dly0 signal 175 and the dly360 signal 199 are substantially in phase. In FIG. 58, assuming $t_{Dmin}=t_I=5$, and assuming $t_A$ is fixed at 4, a clock cycle of 14 achieves lock when tCK=14=D+I+D+I−S−S or $t_D+t_D-t_A-t_A$. The first alignment indicator 410 and the second alignment indicator 420 show the rising edge of the ph180 signal 125 is substantially one-half the clock cycle after the ph0 signal 165. This phase delay magnitude is consistent with the equations noted above.

In a final example of the first operation mode, with reference to FIGS. 3 and 5C, the clock period of 12 is substantially near the minimum delay through the first delay line 110 and the second delay line 120. In this example, the alignment magnitude is set to an initial value substantially near zero giving the first phase aligner 160 and the second phase aligner 170 delays substantially near zero.

The feedback loop, including the phase comparison combined with increasing or decreasing adjustments of the phase delay magnitude, continues until the phase comparison shows the phase of the dly0 signal 175 and the dly360 signal 199 are substantially in phase. In FIG. 5C, with a clock cycle of 12 units, when phase lock is achieved, the phase delay magnitude is about 6 units. The first alignment indicator 410 and the second alignment indicator 420 show the rising edge of the ph180 signal 125 is substantially one-half the clock cycle after the ph0 signal 165. With the clock cycle at or near the minimum delay of the delay lines, the phase delay magnitude cannot be decreased any further and phase lock will not be possible at smaller clock periods unless the alignment magnitude is increased.

Figure 6A:
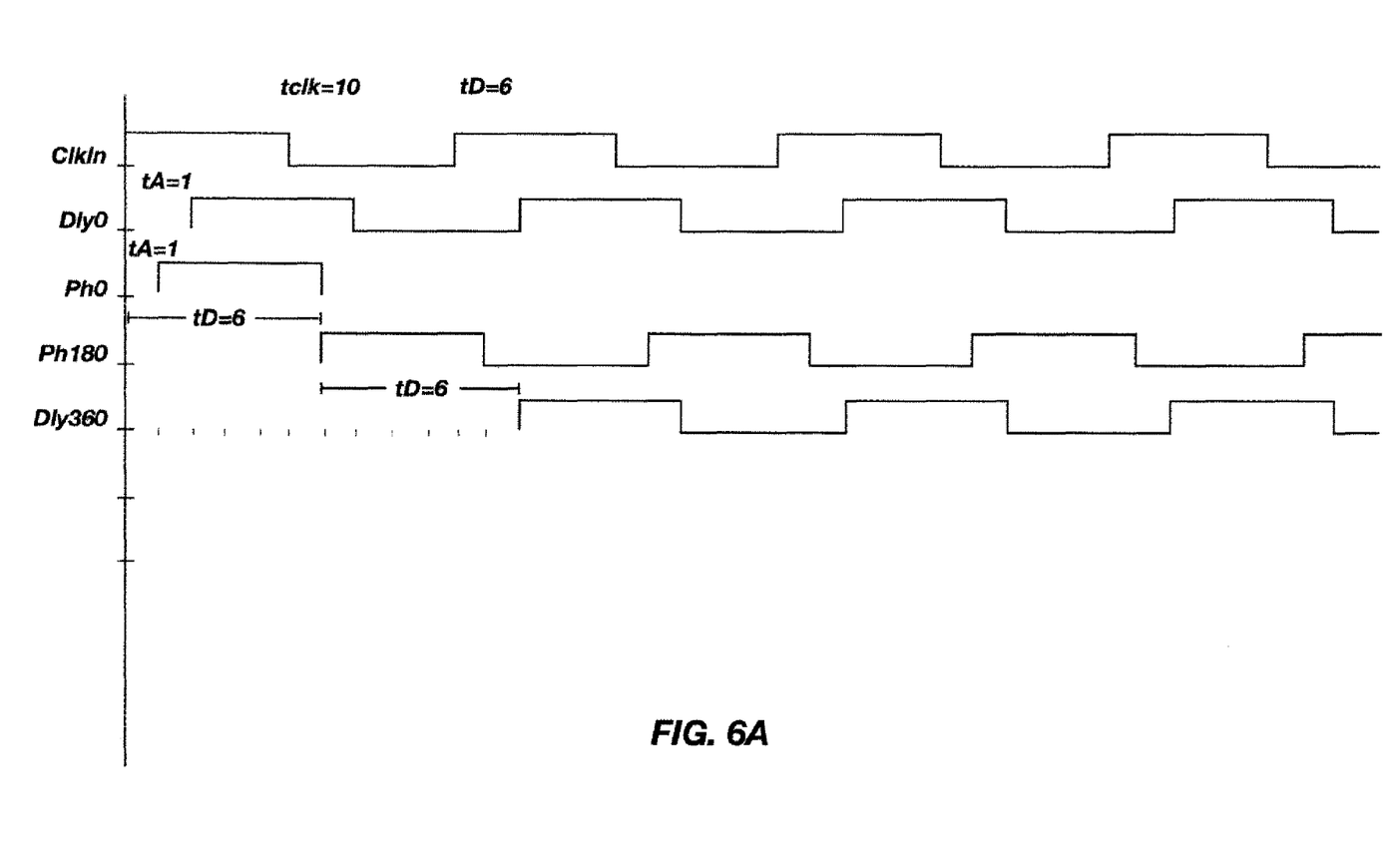
FIG. 6A is a timing waveform showing operation of various phases for the FIG. 3 embodiment at a clock cycle of 10 units, in accordance with an embodiment of the present invention.
Figure 6B:
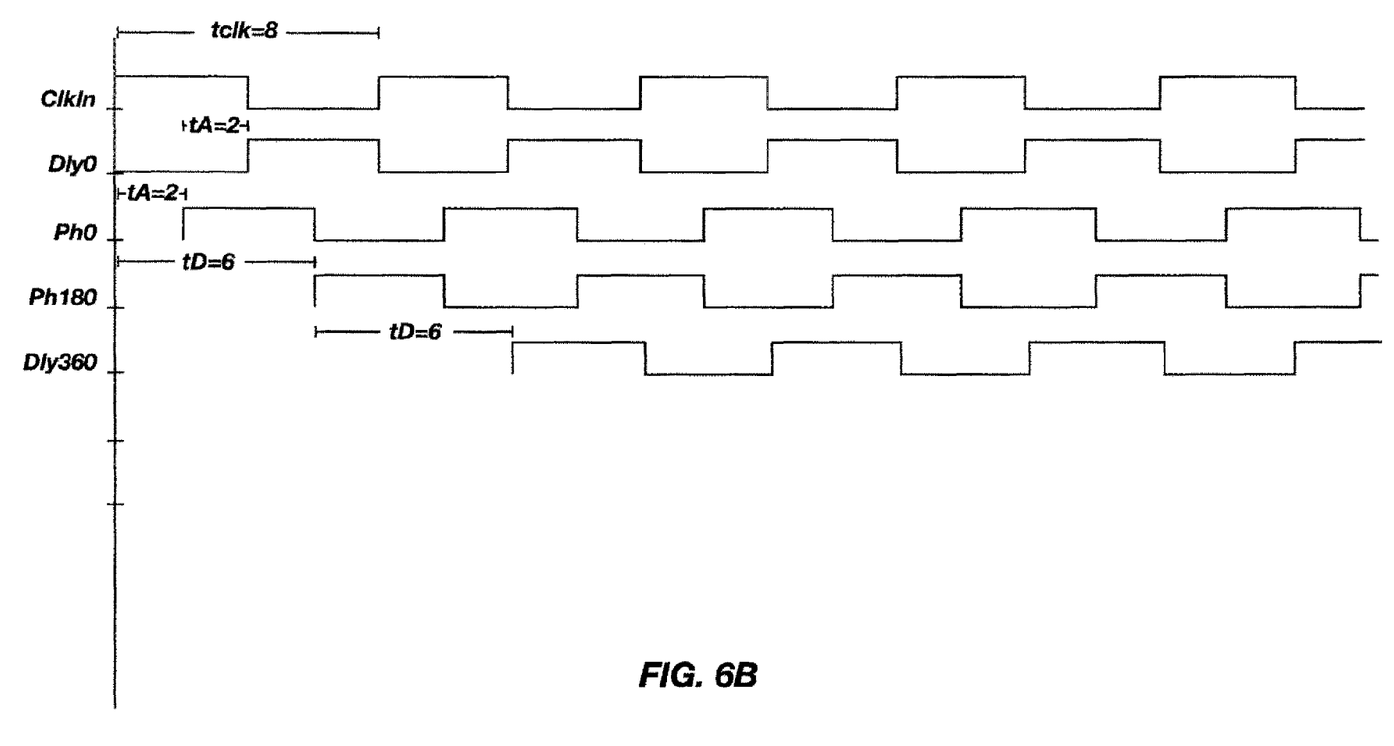
FIG. 6B is a timing waveform showing operation of various phases for the FIG. 3 embodiment at a clock cycle of 8 units in accordance with an embodiment of the present invention.
Figure 6C:
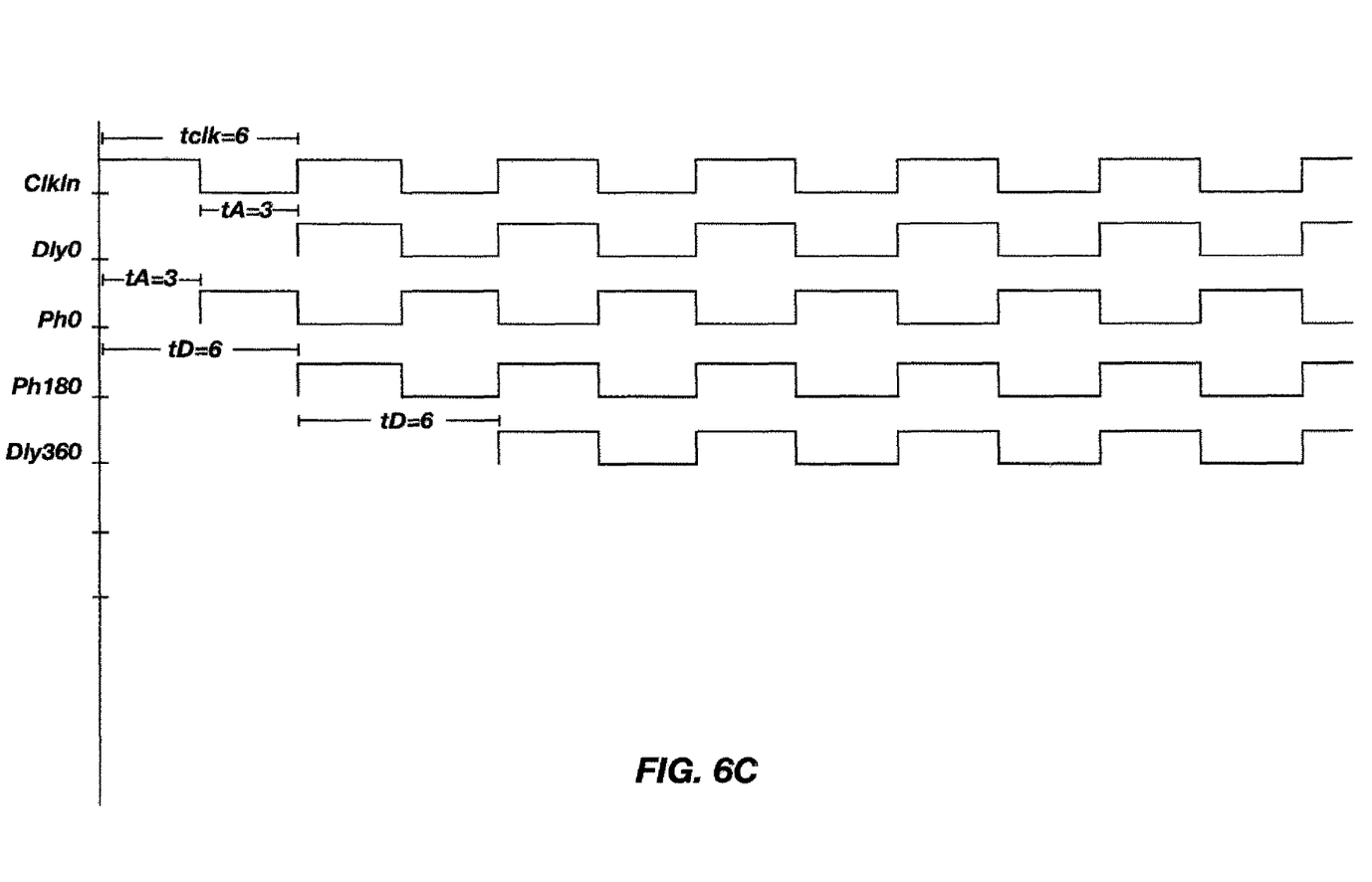
FIG. 6C is a timing waveform showing operation of various phases for the FIG. 3 embodiment at a clock cycle of 6 units, in accordance with an embodiment of the present invention.

This situation is when the second operation mode becomes advantageous. In the second operation mode, the phase delay magnitude is held constants perhaps at the minimum delay, while the alignment magnitude is adjusted by starting at $t_A$ or "S"=max and reducing until lock or $t_A\approx0$. The second operation mode is illustrated in FIGS. 6A, 6B, and 6C. In the second mode of operation, the first phase aligner 160 may be contemplated as an element that effectively compresses the clock cycle (i.e., the delay between the ph0 signal 165 and the dly360 signal 199), which could not be completely compressed to match the clock input 105 by the phase delay lines because the phase delay magnitude is held constant. The second phase aligner 170 inserts additional alignment magnitude equal to phase aligner 160 into the feedback loop for comparison by the phase detector 150.

For example, with reference to FIGS. 3 and 6A, assume the phase delay magnitude $t_D$ is set to a minimum delay of 6 units and the clock cycle is 10 units. With a phase delay magnitude at $t_D+t_D=12$, the rising edge of the dly360 signal 199 is greater than a clock cycle delay from the rising edge of the clock input 105. However, the phase aligners 160 and 170 may be used to delay the dly0 signal 175 so that the delay from the dly0 signal 175 to the dly360 signal 199 is substantially near a clock cycle. Rather than changing the phase adjustment signal 152 to modify the phase delay magnitude, the phase detector 150 may change the alignment adjustment signal 158 to increasing or decreasing the alignment magnitude to achieve phase lock. If the alignment magnitude starts near its maximum but still less than or equal to $t_I$, the phase detector 150 will decrease the alignment magnitude until the dly0 signal 175 and the dly360 signal 199 are substantially in phase, or until $t_A$ or "S" reaches Ø (zero) delay. The delay $t_D$ is then increased until lock is achieved.

In FIG. 6A, the alignment magnitude is adjusted to 1 unit. Since the dly360 signal 199 is essentially held at fixed point and the dly0 signal 175 is moved closer to the dly360 signal 199, the ph180 signal 125 must also be moved closer to the dly360 signal 199. The present example illustrates one of the advantages of the various embodiments of the present invention over the prior art of FIG. 2. With respect to the prior art of FIG. 2, if clock input 105 were set to 10 units and the phase delay magnitude were set to the minimum delay of 6 units, then the alignment magnitude would need to be adjusted to 2 units which would cause ph0 signal 165 to be delayed from the clock input 105 by twice the delay as is inserted by the various embodiments of the present invention.

In another example of the second operation mode, with reference to FIGS. 3 and 6B, the phase delay magnitude is set near the minimum delay of 6 units and the clock cycle is 8 units. In similar operation to the FIG. 6A diagram explained above, the phase detector 150 adjusts the alignment magnitude until the dly0 signal 175 and the dly360 signal 199 are substantially in phase. In FIG. 6B, this results in an alignment magnitude of 2 units for the delay through the first phase aligner 160, and a delay through the second phase aligner 170 of 2 units. Similarly, the present example, when implemented on one of the various embodiments of the present invention, results in a 2 unit ph0 delay between clock input 105 and the ph0 signal 165 while in the prior art circuit of FIG. 2, the ph0 forward path intrinsic delay (ph0 FPID) is increased and the delay between ph0 signal and the input clock is 4 units.

In another example of the second operation mode, with reference to FIGS. 3 and 6C, operation is shown illustrating an alignment magnitude that approaches the clock period. In the FIG. 6C example the phase delay magnitude is set near the minimum delay of 6 units and the clock cycle is 6 units. As a result, the dly360 signal 199 is about two clock cycles behind the clock input 105. However, the alignment magnitude may still be adjusted to a value sufficient to adjust the dly0 signal 175 to be substantially in phase with the dly360 signal 199. In this case, the phase lock occurs when the alignment magnitude is at 3 units. This operation may be extrapolated to multiple clock cycles difference between the clock input 105 and the dly360 signal 199. Phase lock may still be achieved if the alignment magnitude is adjustable to at least a full clock period. Generally, S begins at the maximum level which is less than I and the phase aligner is shifted to the right (i.e., as minimum as possible) as much as possible in an attempt to find a locking point. If the phase aligner hits the far right (minimum delay) without locking, then the phase aligner is held at the far right and delay is added to the delay line until a lock is located.

It will be readily apparent to a person of ordinary skill in the art that the first and second operation modes may be combined in various ways. As an example only, the phase detector 150 may set the alignment magnitude to substantially near zero and enter the first operation mode. The first operation mode may reduce the phase delay magnitude until it is substantially near the minimum delay, or some other desirable delay. The phase detector 150 may then enter the second operation mode and begin increasing the alignment magnitude until lock is achieved.

Figure 4:
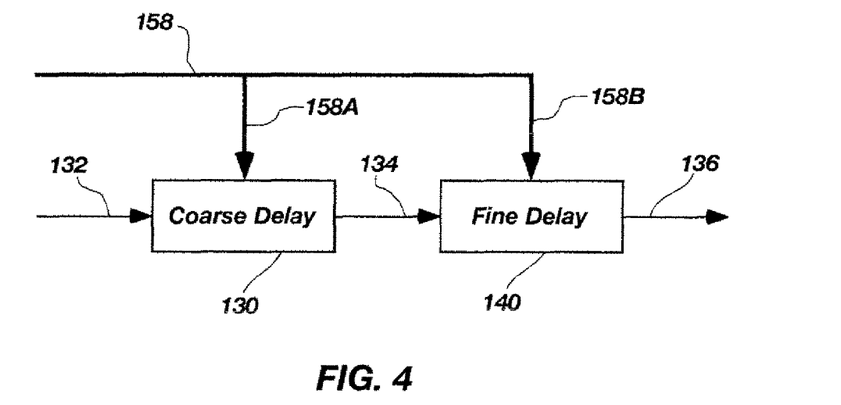
FIG. 4 is a block diagram of an exemplary delay line, in accordance with an embodiment of the present invention.

The delay lines of the embodiments described above may be comprised of a coarse delay line 130 and a fine delay line 140 similar to the exemplary embodiment shown in FIG. 4. In the FIG. 4 embodiment, the alignment adjustment signal 158 may include a group of coarse adjustment signals 158A and fine adjustment signals 158B. An input 132 to the delay line connects to the coarse delay line 130. The coarse delay line output 134 connects to the fine delay line 140. A fine delay output 136 may be used as the output of the delay line. It will be readily apparent to a person of ordinary skill in the art that many other configurations and connections of coarse delays and fine delays are possible and contemplated within the invention.

Figure 7:
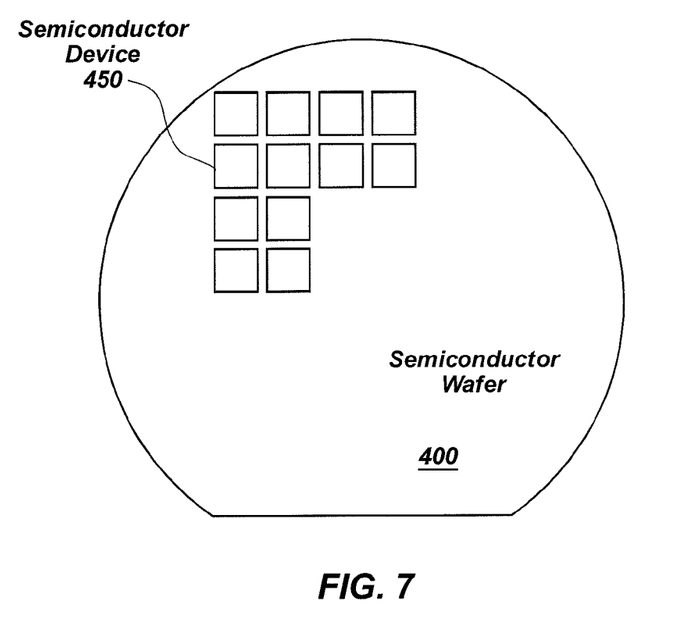
FIG. 7 is a semiconductor wafer, including a plurality of semiconductor devices including a phase generator, in accordance with an embodiment of the present invention.

As shown in FIG. 7, a semiconductor wafer 400, in accordance with the present invention, includes a plurality of semiconductor devices 450 incorporating the phase generator 100 described herein. Of course, it should be understood that the semiconductor devices 450 may be fabricated on substrates other than a silicon wafer, such as, for example, a Silicon On Insulator (SOI) substrate, a Silicon On Glass (SOG) substrate, or a Silicon On Sapphire (SOS) substrate, a gallium arsenide wafer, an indium phosphide wafer, or other bulk semiconductor substrates. As used herein, the term "wafer" includes and encompasses all such substrates.

Figure 8:
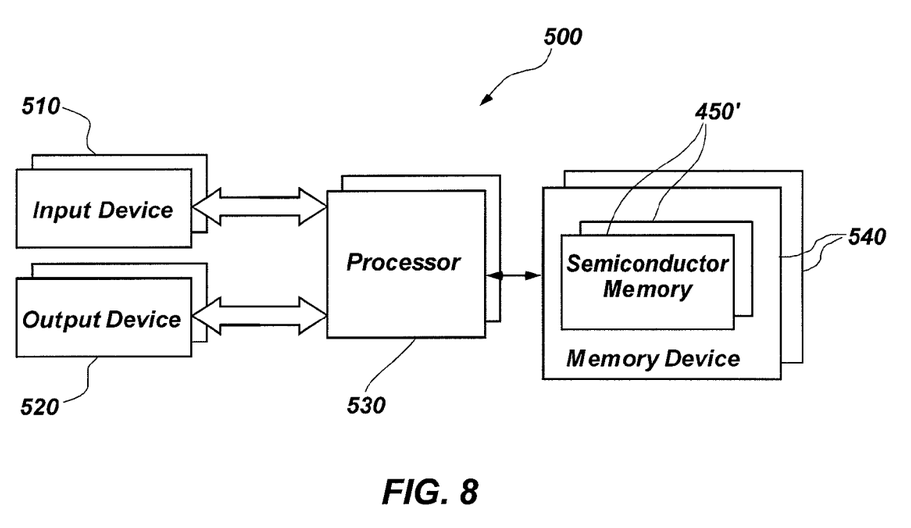
FIG. 8 is an electronic system diagram showing a plurality of semiconductor memories including a phase generator, in accordance with an embodiment of the present invention.

As shown in FIG. 8, an electronic system 500, in accordance with the present invention, comprises at least one input device 510, at least one output device 520, at least one processor 530, and at least one memory device 540. The memory device 540 comprises at least one semiconductor memory 450' incorporating the phase generator 100 described herein in a DRAM device. It should be understood that the semiconductor memory 450' may comprise a wide variety of devices other than, or in addition to, a DRAM, including, for example, Static RAM (SRAM) devices and Flash memory devices.

Although this invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. A method of generating multi-phase clocks, comprising:
   delaying a clock input through a first phase aligner generating a first phase signal and delaying the first phase signal through a substantially similar second phase aligner generating a first phase delay signal;
   delaying the clock input through a first delay line generating a second phase delay signal and through a substantially similar second delay line generating a last phase delay signal; and
   adjusting at least one of a phase delay magnitude and an alignment magnitude according to a phase difference between the first delay signal and the last phase delay signal.

2. The method of claim 1, further comprising adjusting the first and second phase aligners by a predetermined amount and adjusting the first and second delay lines proportional to the phase difference until the phase difference is substantially near zero.

3. The method of claim 2, wherein the predetermined amount is substantially near zero phase adjustment.

4. The method of claim 1, further comprising adjusting the first and second delay lines to a predetermined amount and adjusting the first and second phase aligners proportional to the phase difference until the phase difference is substantially near zero.

5. The method claim 4, wherein the predetermined amount is substantially near a minimum delay.

6. A phase generator, comprising:
   a phase alignment path generating an intermediate first phase signal in response to an input clock and a first phase delay signal in response to the intermediate first phase signal;
   a delay path generating an intermediate second phase signal and a last phase delay signal in response to the input clock; and
   a phase detector configured to generate at least one of a phase adjustment signal for modifying at least one of the phase alignment path and the delay path.

7. The phase generator of claim 6, wherein the phase detector is configured to adjust the phase alignment path to a predetermined amount and adjust the delay path so the first phase delay signal and the last phase delay signal are substantially in phase.

8. The phase generator of claim 7, wherein the predetermined amount is substantially near zero.

9. The phase generator of claim 6, wherein the phase detector is configured to adjust the delay path a predetermined amount and to adjust the phase alignment path so the first phase delay signal and the last phase delay signal are substantially in phase.

10. The phase generator of claim 9, wherein the predetermined amount is substantially near a minimum delay.

11. The phase generator of claim 6, wherein the delay path comprises a coarse delay line with a coarse delay magnitude and a fine delay line with a fine delay magnitude.

12. A phase generator, comprising:
   a phase alignment path configured to generate an intermediate first phase signal in response to an input clock and a first phase delay signal in response to the intermediate first phase signal;
   a phase detector configured to generate a phase adjustment signal for modifying the phase alignment path; and
   a delay path generating an intermediate second phase signal and a last phase delay signal in response to the input clock, wherein the phase detector is further configured to generate the phase adjustment signal for modifying the delay path, to adjust the phase alignment path to a predetermined amount and to adjust the delay path so the first phase delay signal and the last phase delay signal are substantially in phase.

13. An electronic system, comprising:
   at least one memory device comprising at least one semiconductor memory including at least one phase generator, the at least one phase generator, comprising:
      a phase alignment path adapted for generating an intermediate first phase signal in response to an input clock and a terminal first phase delay signal in response to the intermediate first phase signal;
      a delay path adapted for generating an intermediate second phase signal and a terminal last phase delay signal in response to the input clock; and
      a phase detector configured to generate at least one of a phase adjustment signal for modifying at least one of the phase alignment path and the delay path.

* * * * *

UNITED STATES PATENT AND TRADEMARK OFFICE
CERTIFICATE OF CORRECTION

| | | |
|---|---|---|
| PATENT NO. | : 7,808,289 B2 | Page 1 of 1 |
| APPLICATION NO. | : 11/847908 | |
| DATED | : October 5, 2010 | |
| INVENTOR(S) | : Gary M. Johnson | |

It is certified that error appears in the above-identified patent and that said Letters Patent is hereby corrected as shown below:

In column 10, line 6, in Claim 5, after "method" insert -- of --.

Signed and Sealed this

Seventh Day of December, 2010

David J. Kappos
*Director of the United States Patent and Trademark Office*